(12) United States Patent
Kuroda et al.

(10) Patent No.: US 6,798,022 B1
(45) Date of Patent: Sep. 28, 2004

(54) SEMICONDUCTOR DEVICE WITH IMPROVED PROTECTION FROM ELECTROSTATIC DISCHARGE

(75) Inventors: Toshikazu Kuroda, Tokyo (JP); Katsuhito Sasaki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/384,714

(22) Filed: Mar. 11, 2003

(51) Int. Cl.[7] .............................................. H01L 23/62
(52) U.S. Cl. ...................... 257/360; 257/355; 257/356; 257/357; 257/173
(58) Field of Search ................................ 257/360, 355, 257/356, 357, 173

(56) References Cited

U.S. PATENT DOCUMENTS

| | | | |
|---|---|---|---|
| 5,119,162 A | * | 6/1992 | Todd et al. ................. 257/370 |
| 5,714,784 A | | 2/1998 | Ker et al. ................... 257/360 |
| 5,838,050 A | * | 11/1998 | Ker et al. ................... 257/401 |
| 6,097,066 A | * | 8/2000 | Lee et al. ................... 257/355 |
| 6,621,133 B1 | * | 9/2003 | Chen et al. ................. 257/409 |
| 6,680,512 B2 | * | 1/2004 | Nishikawa et al. ......... 257/355 |

* cited by examiner

Primary Examiner—Nathan J. Flynn
Assistant Examiner—Remmon R. Fordé
(74) Attorney, Agent, or Firm—Volentine Francos, PLLC

(57) ABSTRACT

A concentric polygonal metal-oxide-semiconductor field-effect transistor is designed to avoid overlap between corners of the central drain diffusion and inner corners of the surrounding annular gate electrode. For example, the gate electrode may be reduced to separate straight segments by eliminating the corner portions. Alternatively, the drain diffusion may have a cross shape, and the outer annular source diffusion may be reduced to straight segments facing the ends of the cross, or the source and drain diffusions and gate electrodes may all be reduced to separate straight segments. By avoiding electric field concentration in the corner regions, these designs provide enhanced protection from electrostatic discharge.

6 Claims, 7 Drawing Sheets

SEMICONDUCTOR DEVICE WITH IMPROVED PROTECTION FROM ELECTROSTATIC DISCHARGE

BACKGROUND OF THE INVENTION

1. Field of the Invention

The present invention relates to a semiconductor device, and more particularly to a metal-oxide-semiconductor field-effect transistor with improved protection against electrostatic discharge.

2. Description of the Related Art

The shrinking dimensions of complementary metal-oxide-semiconductor (CMOS) integrated circuits require special designs for transistors that conduct large amounts of current. Such transistors are found in particular in CMOS input and output circuits, where they are needed to drive heavy loads and to provide protection from electrostatic discharge (ESD).

One known high-current transistor design is the finger design illustrated in FIG. 1, which places multiple gate electrodes 1 between an alternating series of source 3 and drain 5 diffusions. If the transistor is an n-channel metal-oxide-semiconductor (NMOS) transistor, for example, the source and drain diffusions 3, 5 are n-type diffusions disposed in a p-type well or substrate 7, and the transistor is surrounded by a $p^+$-type diffusion 9 through which a fixed potential is supplied to the well or substrate 7. Since the $p^+$-type diffusion 9 helps prevent CMOS latch-up, it is also known as a guard ring. For an n-channel transistor, the source and guard ring diffusions 3, 9 are normally coupled to ground. The finger design provides ample total channel width to drive a large load, or to shunt ESD current safely from the drain diffusions 5 to the source diffusions 3.

As shown in FIG. 2, however, parasitic diodes 10 are formed between the ends of the drain diffusions 5 and the guard ring diffusion 9. If these diffusions 5, 9 are too close together, the parasitic diodes 10 may break down under ESD stress, leading to thermal damage as discharge current surges through the relatively small total diode width. To avoid such damage, enough space to prevent breakdown must be provided between the drain diffusions 5 and guard ring diffusion 9, but this increases the area of the transistor.

U.S. Pat. No. 5,714,784, issued to Ker et al., discloses an alternative design, shown in FIG. 3, in which a guard ring diffusion 9, source diffusion 11, and gate electrode 13 form concentric square loops converging on a central square drain diffusion 15. By separating the drain and guard ring diffusions, this design eliminates the parasitic diode shown in FIG. 2, enabling the transistor dimensions to be reduced without loss of ESD robustness.

The transistor in FIG. 3 is vulnerable to damage, however, at the overlapping corners 16 of the gate electrode 13 and drain diffusion 15. This problem is thought to result from electric field concentration combined with poor gate oxide quality at the corners 16. Although the failure mechanism is not understood in detail, it is known that in general the gate-drain breakdown voltage of a field-effect transistor decreases as the number of corners in its active region increases. The result of an oxide breakdown under ESD stress is often fatal to the device: the ESD current burns a hole through the oxide film.

SUMMARY OF THE INVENTION

An object of the present invention is to provide a semiconductor device with improved protection from electrostatic discharge.

Another object of the invention is to simplify the design of a semiconductor device to provide a specified level of protection from electrostatic discharge.

The inventive semiconductor device has a semiconductor substrate covered by an oxide film.

According to a first aspect of the invention, a polygonal drain diffusion is disposed in the substrate, an annular polygonal source diffusion is disposed in the substrate surrounding the drain diffusion, and a plurality of gate electrodes are disposed on the oxide film between mutually facing sides of the polygonal source and drain diffusions, partially overlapping the facing sides of the source and drain diffusions but avoiding corners of the drain diffusion.

According to a second aspect of the invention, an annular polygonal gate electrode is disposed on the oxide film, a plurality of source diffusions are disposed in the substrate, facing and partially beneath respective exterior sides of the gate electrode, and a polygonal drain diffusion with deleted corners is disposed in the substrate, facing and partially beneath the interior sides of the gate electrode but avoiding the interior corners of the gate electrode.

According to a third aspect of the invention, a plurality of drain diffusions are disposed in the substrate on respective sides of a polygonal area of the substrate, avoiding corners of the polygonal area. A plurality of source diffusions are disposed in the substrate exterior to the polygonal area and drain diffusions, facing the drain diffusions at a certain distance. A plurality of gate electrodes are disposed on the oxide film between mutually facing sides of the source and drain diffusions, partially overlapping the facing sides of the source and drain diffusions.

In any of these aspects of the invention, the semiconductor device may also include an annular guard ring diffusion disposed in the substrate surrounding the source diffusion or diffusions. The semiconductor substrate and guard ring diffusion are preferably of a first conductive type, the source and drain diffusions being of a second conductive type.

The semiconductor device may have a first metal interconnection pattern coupling the source diffusion or diffusions to a power-supply or ground potential, and a second metal interconnection pattern coupling the drain diffusion or diffusions to an input or output lead of an integrated circuit in which the semiconductor device is a circuit element. The first metal interconnection pattern may also couple the gate electrode or electrodes to the power-supply or ground potential.

The invention provides improved protection from electrostatic discharge by avoiding gate-drain overlap in corner areas, thereby avoiding electric field concentration in areas where oxide quality is comparatively poor.

The second and third aspects of the invention simplify the design of the semiconductor device because the level of protection from electrostatic discharge depends linearly on the polygonal side dimensions of the device.

The third aspect of the invention also simplifies the design of the semiconductor device by providing added layout flexibility.

DETAILED DESCRIPTION OF THE INVENTION

Figure 1:
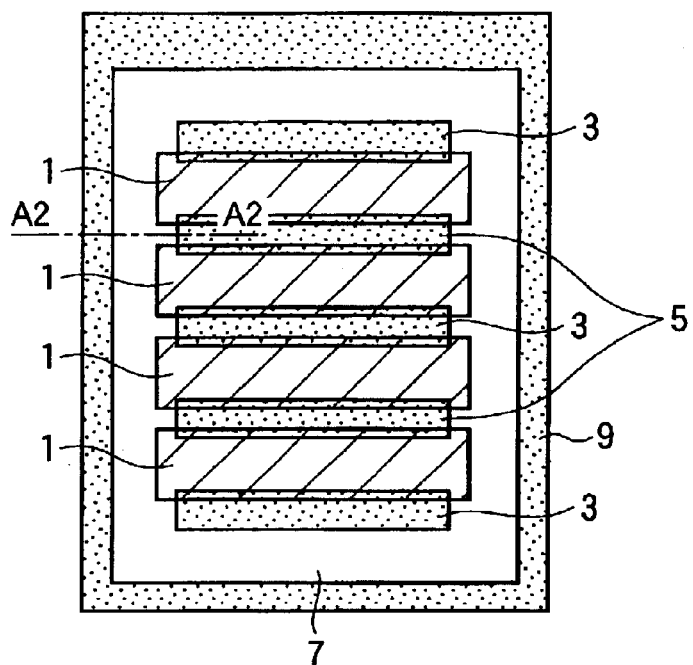
FIG. 1 is a plan view of a conventional finger-type field-effect transistor.
Figure 2:
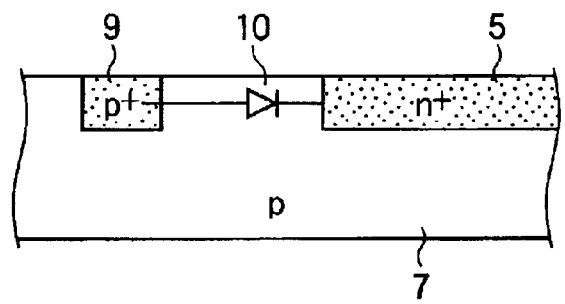
FIG. 2 is a sectional view through line A2—A2 in FIG. 1.

Embodiments of the invention will now be described with reference to the attached drawings, in which like elements are indicated by like reference characters.

Figure 4:
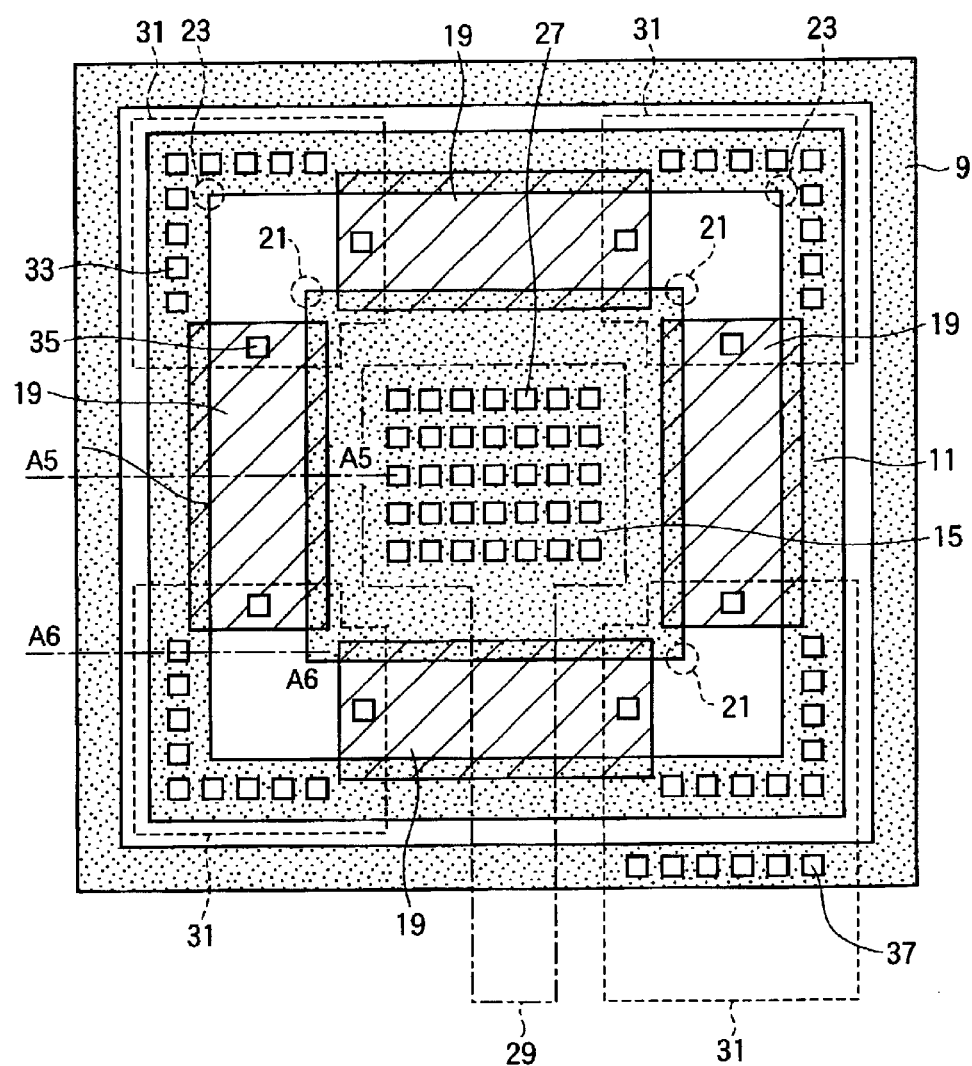
FIG. 4 is a plan view of a field-effect transistor embodying the first aspect of the invention.
Figure 5:
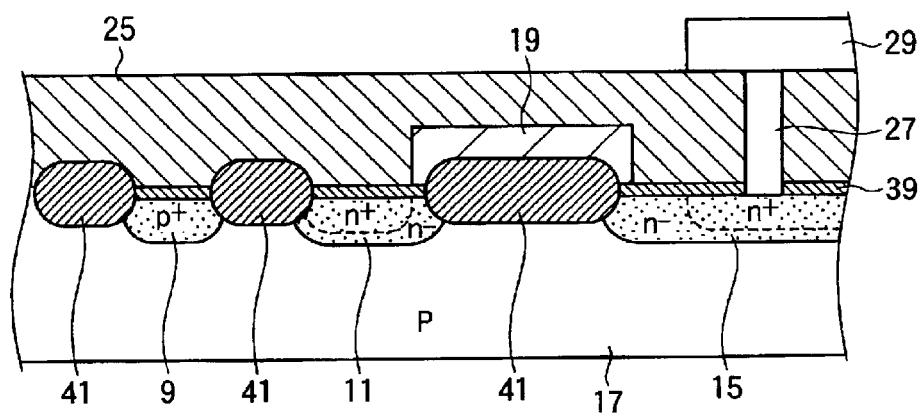
FIG. 5 is a sectional view through line A5—A5 in FIG. 4.
Figure 6:
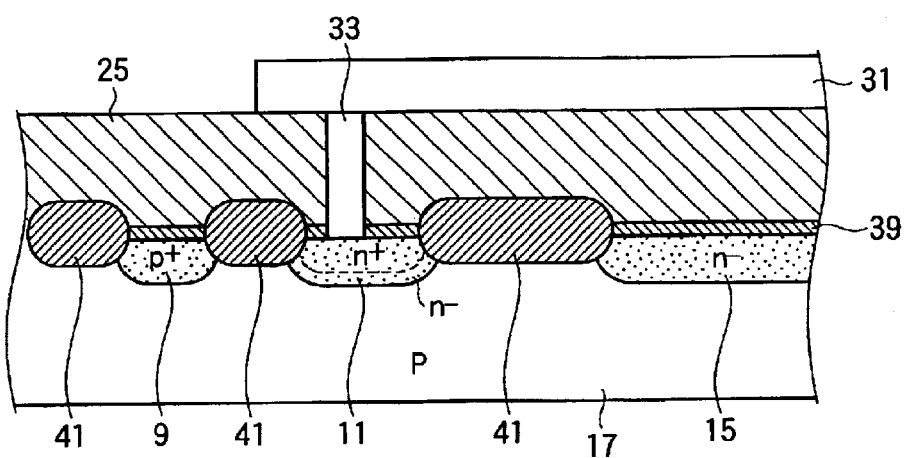
FIG. 6 is a sectional view through line A6—A6 in FIG. 4.

As a first embodiment of the invention, FIGS. 4–6 show a field-effect transistor comprising a guard ring diffusion 9, a source diffusion 11, and a drain diffusion 15 formed in a silicon semiconductor substrate 17. As shown in FIG. 4, the drain diffusion 15 is square, the source diffusion 11 is a square annulus surrounding the drain diffusion 15, and the guard ring diffusion 9 is a square annulus surrounding the source diffusion 11.

Disposed between the four sides of the drain diffusion 15 and the facing sides of the source diffusion 11, and partially overlapping these sides, are four gate electrodes 19, each a rectangular body of polycrystalline silicon (polysilicon) formed on the substrate 17, insulated from the substrate 17 by an oxide film (not visible). The gate electrodes 19 do not overlap the corners 21 of the drain diffusion 15, or the corners 23 of the source diffusion 11. The substrate 17, diffusions 9, 11, 15, and gate electrode 19 are covered by an interlayer dielectric film 25 shown in FIGS. 5 and 6.

The transistor may be either an n-channel (NMOS) transistor or a p-channel (PMOS) transistor. For an n-channel transistor, the source and drain diffusions 11, 15 are n-type, the substrate 17 is p-type, and the guard ring diffusion 9 is $p^+$-type, as illustrated in the drawings. The source and drain diffusions 11, 15 include both a comparatively lightly doped $n^-$ portion and a comparatively heavily doped $n^+$ portion, as shown. For a p-channel transistor (not illustrated), the source and drain diffusions 11, 15 are p-type (with $p^-$ and $p^+$ portions), the substrate 17 is n-type, and the guard ring diffusion 9 is $n^+$-type.

The drain diffusion 15 is electrically coupled by a plurality of metal contacts 27 to a metal drain interconnection pattern 29 disposed above the interlayer dielectric film 25. Four metal source interconnection patterns 31 are also formed on the interlayer dielectric film 25, and are electrically coupled by metal contacts 33, 35 to the source diffusion 11 and the gate electrodes 19. One of the source interconnection patterns 31 is also coupled by metal contacts 37 to the guard ring diffusion 9. The drain interconnection pattern 29 is coupled to, for example, an input or output signal lead (not shown) of an integrated circuit in which the transistor in FIGS. 4–6 forms one circuit element. The four source interconnection patterns 31 are coupled to ground if the transistor is an n-channel device, or to the power supply if the transistor is a p-channel device.

The above interconnections are appropriate if the transistor is used for ESD protection, but the first embodiment is not limited to these interconnections. For example, the guard ring 9 can receive a fixed potential different from the ground or power-supply potential, and the gate electrodes 19 can receive a signal potential instead of the ground or power-supply potential.

The gate electrodes 19 are insulated from the substrate 17 by an oxide film 39 including thick field oxide portions 41. The field oxide portions 41 surround the guard ring 9, separate the guard ring 9 from the source diffusion 11, and separate the source diffusion 11 from the drain diffusion 15. The gate electrodes 19 are disposed above the last of these field oxide portions 41, but extend beyond the field oxide portions onto the thinner parts of the oxide film 39.

Figure 3:
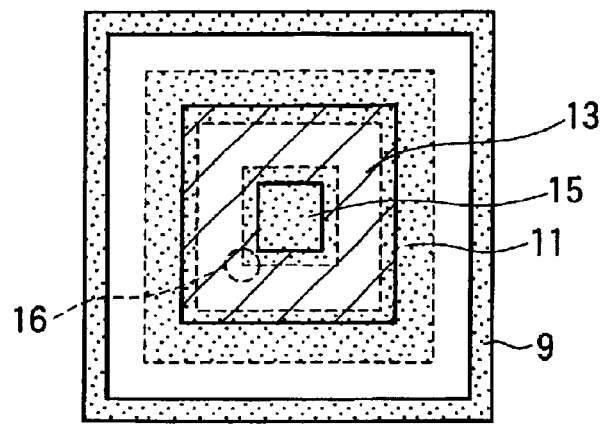
FIG. 3 is a plan view of another conventional type of field-effect transistor.

The transistor in the first embodiment operates in much the same way as the prior-art device shown in FIG. 3, providing ESD protection by shunting surge current from the drain interconnection pattern 29 through the drain diffusion 15, the channel region underlying the gate electrodes 19, the source diffusion 11, and the source interconnection patterns 31 to the power supply or ground. During an ESD event, a strong electric field is created between the gate electrodes 19 and the drain diffusion 15. In FIG. 3, this field becomes most intense at the corners 16 of the gate electrode 13, which coincide with the corners of the drain diffusion 15. It is precisely at these corner areas that the quality of the gate oxide film is poorest and the risk of an oxide breakdown is highest. In the invented transistor in FIGS. 4–6, the gate electrodes 19 avoid the corners 21 of the drain diffusion 15, so there is no concentrated electric field at the points where the oxide film 39 is most vulnerable to breakdown. The first embodiment therefore provides a higher degree of ESD protection than is attained by the prior art in FIG. 3.

Figure 7:
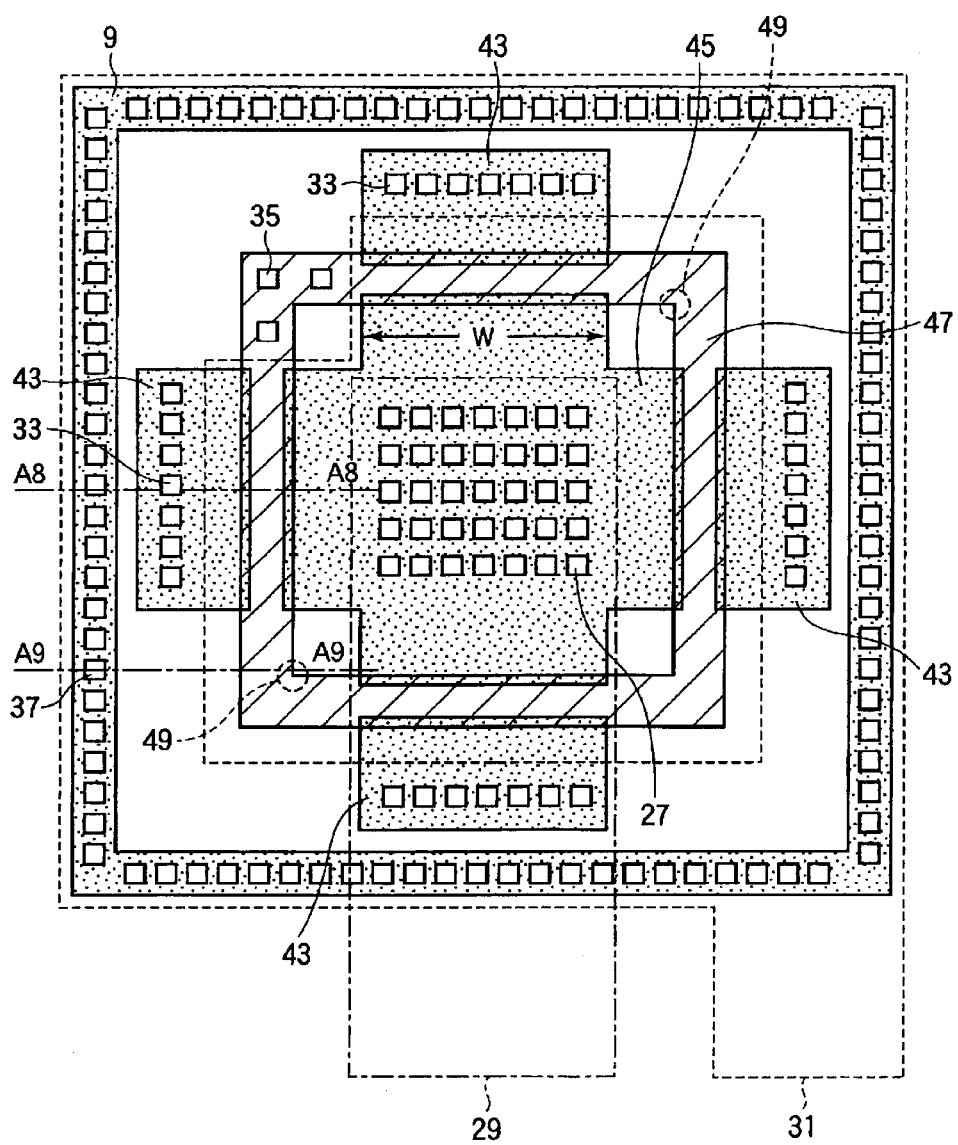
FIG. 7 is a plan view of a field-effect transistor embodying the second aspect of the invention.

As a second embodiment of the invention, FIG. 7 shows a field-effect transistor comprising a guard ring diffusion 9, four source diffusions 43, and a drain diffusion 45 formed in a silicon semiconductor substrate. For an n-channel transistor, the source and drain diffusions 43, 45 are n-type with $n^+$ and $n^-$ regions, the substrate is p-type, and the guard ring diffusion 9 is $p^+$-type; for a p-channel transistor, the source and drain diffusions 43, 45 are p-type with $p^+$ and $p^-$ regions, the substrate is n-type, and the guard ring diffusion 9 is $n^+$-type. The drain diffusion 45 has the shape of a stubby square cross, that is, a square with the four corners removed. The source diffusions 43 are rectangles facing the four ends of the drain diffusion 45. The guard ring diffusion 9 is a square annulus surrounding the source diffusions 43.

Figure 8:
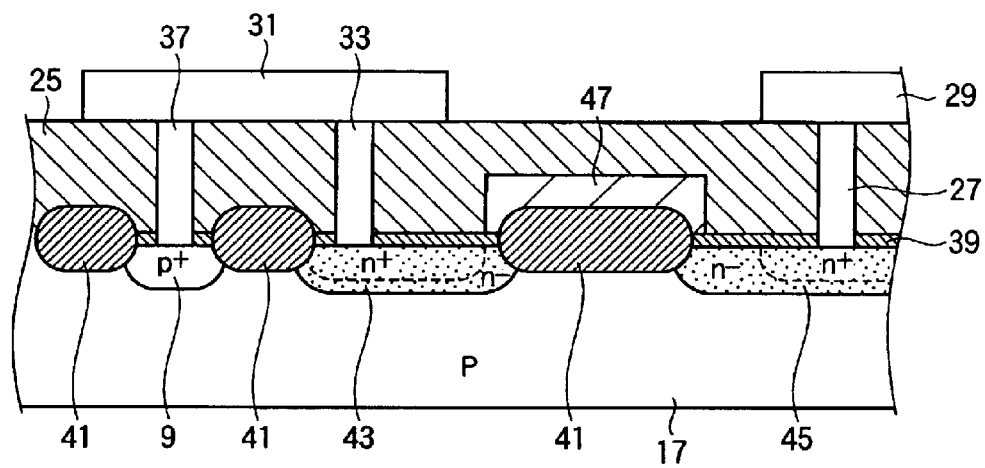
FIG. 8 is a sectional view through line A8—A8 in FIG. 7.
Figure 9:
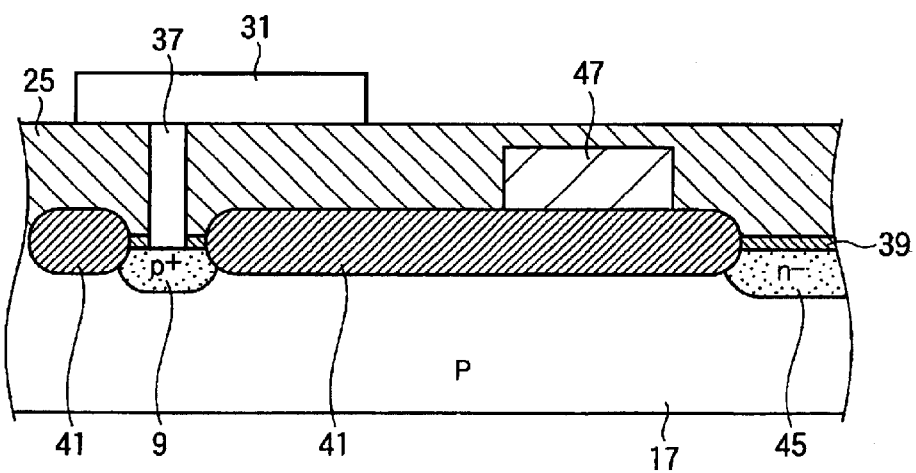
FIG. 9 is a sectional view through line A9—A9 in FIG. 7.

The gate electrode 47 in this transistor has a square annular shape covering the four channel regions between the source diffusions 43 and the stubby ends of the drain diffusion 45, and partly overlapping the source and drain diffusions 43, 45. The gate electrode 47 is, for example, a polysilicon electrode insulated from the substrate 17 by an oxide film 39 having thick field oxide portions 41 as shown in FIGS. 8 and 9. The gate electrode 47 and substrate 17 are covered by an interlayer dielectric film 25.

As in the first embodiment, the drain diffusion 45 is electrically coupled through metal contacts 27 to a metal drain interconnection pattern 29, and the source diffusions 43, gate electrode 47, and guard ring 9 are coupled to a source interconnection pattern 31 through metal contacts 33, 35, 37. The metal source interconnection pattern 31 is coupled to ground for an n-channel transistor (the type illustrated in FIGS. 8 and 9), or to the power supply for a p-channel transistor (not illustrated). The metal drain interconnection pattern 29 is coupled to, for example, an input or output lead of an integrated circuit in which the transistor in FIGS. 7–9 resides.

The second embodiment operates in substantially the same way as the first embodiment, providing ESD protection by shunting surge current from drain to source, thus to the power supply or ground. Damage to the oxide film 39 is avoided because the corners 49 of the gate electrode 47 do not coincide with any corners of the drain diffusion 45. The electric field created by an electrostatic discharge is accordingly not concentrated in the corner areas, where the oxide film 39 is most vulnerable to breakdown.

Figure 10:
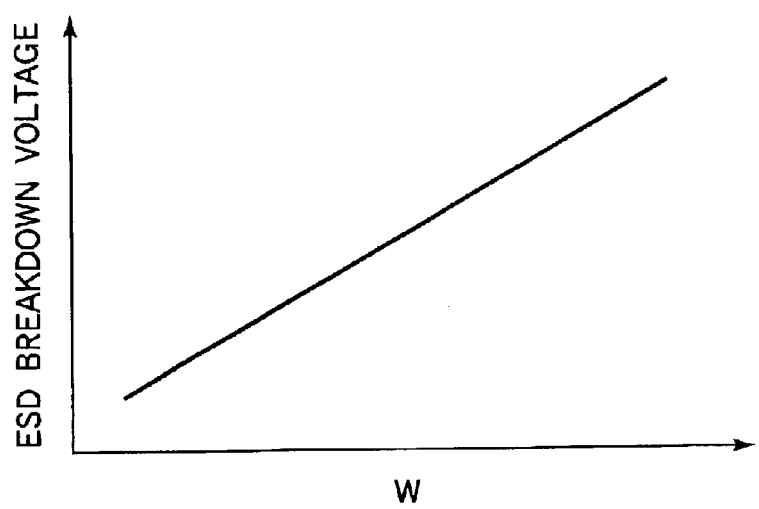
FIG. 10 is a graph illustrating the dependence of ESD breakdown voltage on channel width in the transistor in FIG. 7.

The degree of ESD protection provided in the second embodiment depends on the dimension W in FIG. 7, corresponding to one-fourth of the total channel width. The dependence is substantially linear, as illustrated in FIG. 10; this linearity facilitates the design of the transistor to provide a given level of ESD protection. The level of ESD protection provided by the prior art in FIG. 3, in contrast, does not have a simple linear dependence on the transistor dimensions, because of the effect of electric field concentration at the overlapping corners 16 of the gate and drain electrodes.

Figure 11:
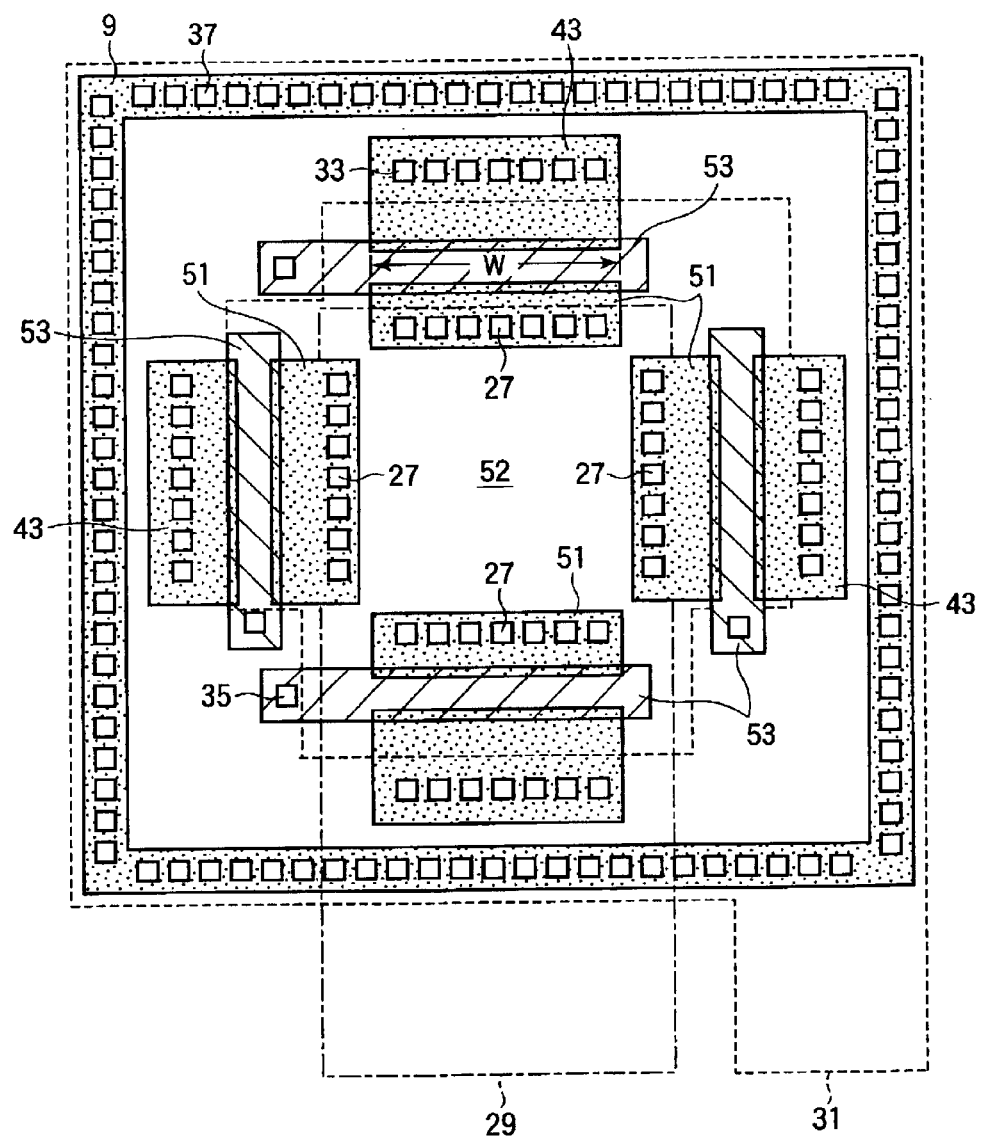
FIG. 11 is a plan view of a field-effect transistor embodying the third aspect of the invention.

As a third embodiment of the invention, FIG. 11 shows a field-effect transistor comprising a guard ring diffusion 9, four source diffusions 43, and four drain diffusions 51 in a silicon semiconductor substrate. The source and drain diffusions 43, 51 are rectangular in shape. For an n-channel transistor, the source and drain diffusions 43, 51 are n-type with $n^+$ and $n^-$ regions, the substrate is p-type, and the guard ring diffusion 9 is $p_+$-type; for a p-channel transistor, the source and drain diffusions 43, 51 are p-type with $p^+$ and $p^-$ regions, the substrate is n-type, and the guard ring diffusion 9 is $n^+$-type. The four drain diffusions 51 substantially surround a central square area 52 in which no diffusion is formed, the drain diffusions 51 being longitudinally parallel to the four sides of the square. The four source diffusions 43 lie outside and face the four drain diffusions 51. The guard ring diffusion 9 is a square annulus surrounding the source diffusions 43.

Four gate electrodes 53 cover the four channel regions between the source diffusions 43 and gate diffusions 51, partly overlapping the source and drain diffusions 43, 51. The gate electrodes 51 are, for example, polysilicon electrodes insulated from the substrate by an oxide film (not shown) having thick field portions as in the preceding embodiments.

A metal drain interconnection pattern 29 is electrically coupled to the drain diffusions 53 through metal contacts 27. A metal source interconnection pattern 31 is electrically coupled to the source diffusions 43, gate electrodes 53, and guard ring 9 through metal contacts 33, 35, 37. These connections are the same as in the preceding embodiments, except that the metal drain interconnection 29 and metal source interconnection pattern 31 in the third embodiment are disposed in separate metal interconnection layers. The metal source interconnection pattern 31 is coupled to ground for an n-channel transistor, or to the power supply for a p-channel transistor. The metal drain interconnection pattern 29 is coupled to, for example, an input or output lead of an integrated circuit in which the transistor in FIG. 11 resides.

The third embodiment operates in substantially the same way as the second embodiment, providing a degree of ESD protection that depends linearly on the dimension W corresponding to one-fourth total channel width. Compared with the prior art in FIG. 3, ESD robustness is improved because the four gate electrodes 53 do not form a square loop with interior corners at which the gate-drain electric field becomes concentrated, so ESD does not stress the gate oxide film at the points at which it is weakest. The extent of the gate electrodes 53 is limited to areas in which the quality of the underlying oxide film is relatively good.

Compared with the first and second embodiments, the third embodiment provides added design and layout flexibility, comprising as it does four ordinary field-effect transistors arranged around the sides of a square.

In a variation of the third embodiment, the four drain electrodes 51 are united into a single drain electrode having the stubby cross shape shown in the second embodiment.

The invention is not limited to transistors having the square shapes shown in the drawings. Similar effects can be obtained in transistors of other polygonal shapes, such as rectangular or hexagonal shapes, by avoiding gate-drain overlap at the corners of the polygonal shape.

The substrate is not limited to silicon, and the gate electrodes are not limited to polysilicon. Other well-known materials may be used.

Those skilled in the art will recognize that further variations are possible within the scope of the invention, which is defined in the appended claims.

What is claimed is:

1. A semiconductor device having a semiconductor substrate covered by an oxide film, the semiconductor device comprising:
   a drain diffusion formed in the semiconductor substrate, the drain diffusion having a polygonal shape;
   a source diffusion formed in the semiconductor substrate, the source diffusion having an annular polygonal shape surrounding the drain diffusion at a certain distance therefrom; and
   a plurality of gate electrodes formed on the oxide film, disposed between mutually facing sides of the drain diffusion and the source diffusion, partially overlapping the mutually facing sides of the drain diffusion and the source diffusion, avoiding corners of the drain diffusion.

2. The semiconductor device of claim 1, further comprising a guard ring diffusion formed in the semiconductor substrate, the guard ring diffusion having an annular shape surrounding the source diffusion.

3. The semiconductor device of claim 2, wherein the semiconductor substrate is a semiconductor of a first conductive type, the source diffusion and drain diffusion are diffusions of a second conductive type, and the guard ring diffusion is a diffusion of the first conductive type.

4. The semiconductor device of claim 3, further comprising a first metal interconnection pattern coupling the source diffusion to a power-supply or ground potential, whereby the semiconductor device provides protection from an electrostatic discharge conducted to the drain diffusion.

5. The semiconductor device of claim 4, wherein the first metal interconnection pattern also couples the plurality of gate electrodes to the power-supply or ground.

6. The semiconductor device of claim 4, further comprising a second metal interconnection pattern coupling the drain diffusion to an input or output lead of an integrated circuit in which the semiconductor device is a circuit element.

* * * * *